(12) United States Patent
Chan et al.

(10) Patent No.: US 7,872,412 B2
(45) Date of Patent: Jan. 18, 2011

(54) ORGANIC LIGHT EMITTING DISPLAY DEVICE AND ELECTRONIC DEVICE

(75) Inventors: Chuan-Yi Chan, Taipei (TW); Du-Zen Peng, Jhubei (TW); Ryuji Nishikawa, Hsinchu (TW)

(73) Assignee: TPO Displays Corp., Chu-Nan (TW)

( * ) Notice: Subject to any disclaimer, the term of this patent is extended or adjusted under 35 U.S.C. 154(b) by 164 days.

(21) Appl. No.: 12/290,198

(22) Filed: Oct. 27, 2008

(65) Prior Publication Data

US 2009/0115326 A1 May 7, 2009

(30) Foreign Application Priority Data

Nov. 2, 2007 (TW) .............................. 96141334 A

(51) Int. Cl.
*H05B 51/00* (2006.01)

(52) U.S. Cl. .................................................. 313/504

(58) Field of Classification Search ................. 313/504, 313/512
See application file for complete search history.

(56) References Cited

U.S. PATENT DOCUMENTS

| 7,023,013 B2 | 4/2006 | Ricks et al. |
| 7,057,339 B2 | 6/2006 | Boroson et al. |
| 7,129,634 B2 | 10/2006 | Boroson et al. |
| 7,208,863 B2 | 4/2007 | Strip |
| 2005/0225232 A1* | 10/2005 | Boroson et al. ............. 313/504 |
| 2006/0192220 A1* | 8/2006 | Nishikawa et al. ............. 257/98 |

* cited by examiner

*Primary Examiner*—Toan Ton
*Assistant Examiner*—Hana S Featherly
(74) *Attorney, Agent, or Firm*—Liu & Liu

(57) ABSTRACT

An organic electroluminescent device is provided. The organic electroluminescent device includes an array substrate having a white sub-pixel region and an organic electro-luminescent multi-layer structure is disposed on the white sub-pixel region of the array substrate. The organic electro-luminescent multi-layer structure comprises a bottom electrode. The bottom electrode has a thinner first portion and a thicker second portion for providing a wavelength shift of light in different directions.

20 Claims, 11 Drawing Sheets

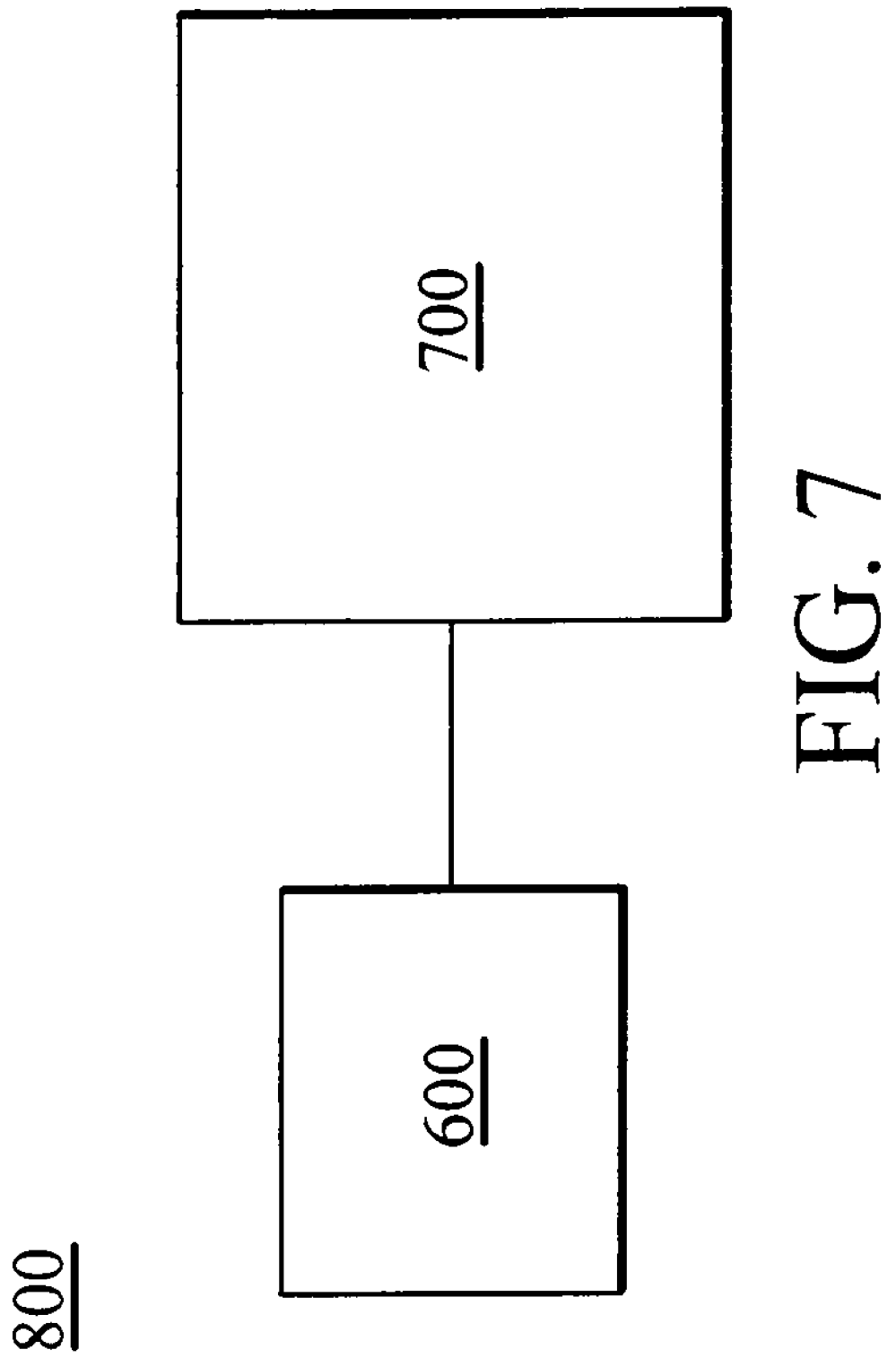

ORGANIC LIGHT EMITTING DISPLAY DEVICE AND ELECTRONIC DEVICE

BACKGROUND OF THE INVENTION

1. Field of the Invention

The invention relates to an organic light-emitting device (OLED) and in particular to an organic light-emitting device with a micro-cavity structure.

2. Description of the Related Art

Organic light emitting diode (OLED) devices are useful in a variety of applications such as watches, telephones, notebook computers, pagers, cell phones, calculators and the like. Each OLED structure typically comprises an anode, a cathode and an organic emission layer interposed therebetween. When an electrical potential is present across the electrodes, holes and electrons are injected into the organic emission layer from the anode and the cathode, respectively. Light emission results from hole-electron recombination within the structure. In an active matrix type OLED device, OLED structures are classified into two types, bottom-emitting and top-emitting types.

FIG. 1 is a sectional view of a conventional top-emitting OLED structure 100. A reflective electrode 120, serving as an anode, is formed on a substrate 110. An organic emission layer 130 is formed on the reflective layer 120. A transparent metal layer 140, serving as a cathode, is formed on the organic emission layer 130. Note that the metal layer 140 reflects some of the emitted light, decreasing light emission efficiency due to the microcavity effect. In the micro-cavity structure, the emitting light may induce constructive and destructive interferences to enhance emission at a specific wavelength. However, the light intensity and wavelength may vary when viewed at various angles, such that the view angle is reduced. In other words, in the OLED with a micro-cavity structure, the color of the emission may be changed (i.e. color shift) when viewed at various angles.

Thus, there exists a need for an improved OLED capable of increasing efficiency while mitigating the color shift problem.

BRIEF SUMMARY OF THE INVENTION

A detailed description is given in the following embodiments with reference to the accompanying drawings.

An embodiment of the invention provides an organic electroluminescent device. The organic electroluminescent device includes an array substrate having a white sub-pixel region and an organic electro-luminescent multi-layer structure disposed on the white sub-pixel region of the array substrate. The organic electro-luminescent multi-layer structure comprises a bottom electrode. The bottom electrode has a thinner first portion and a thicker second portion for providing a wavelength shift of light in different directions.

BRIEF DESCRIPTION OF THE DRAWINGS

The present invention can be more fully understood by reading the subsequent detailed description and examples with references made to the accompanying drawings, wherein:

FIG. 3a through FIG. 3d shows the cross-sectional views of an embodiment of the fourth sub-pixel area of FIG. 2a;

FIG. 7 shows a pixel element incorporated into an electronic device such as an OLED panel.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
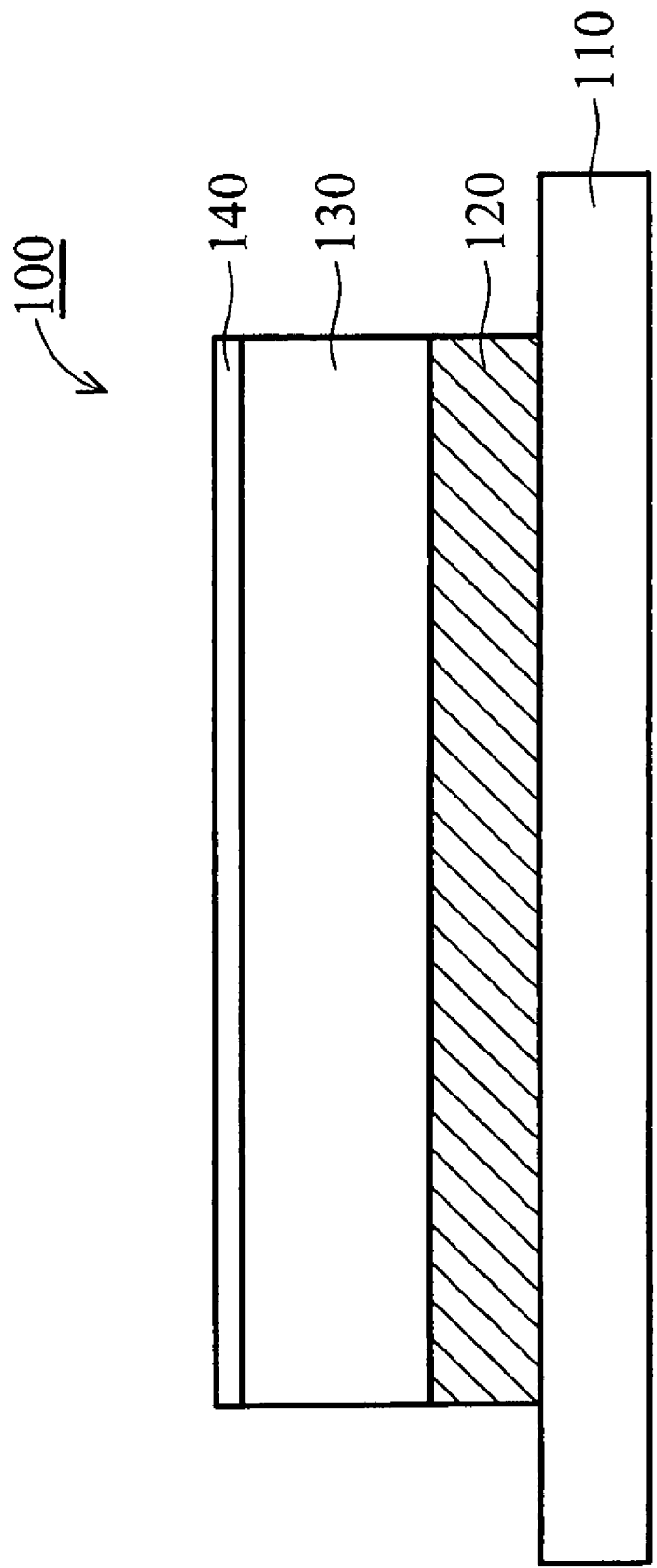
FIG. 1 shows a sectional view of a top-emitting OLED structure.
Figure 2A:
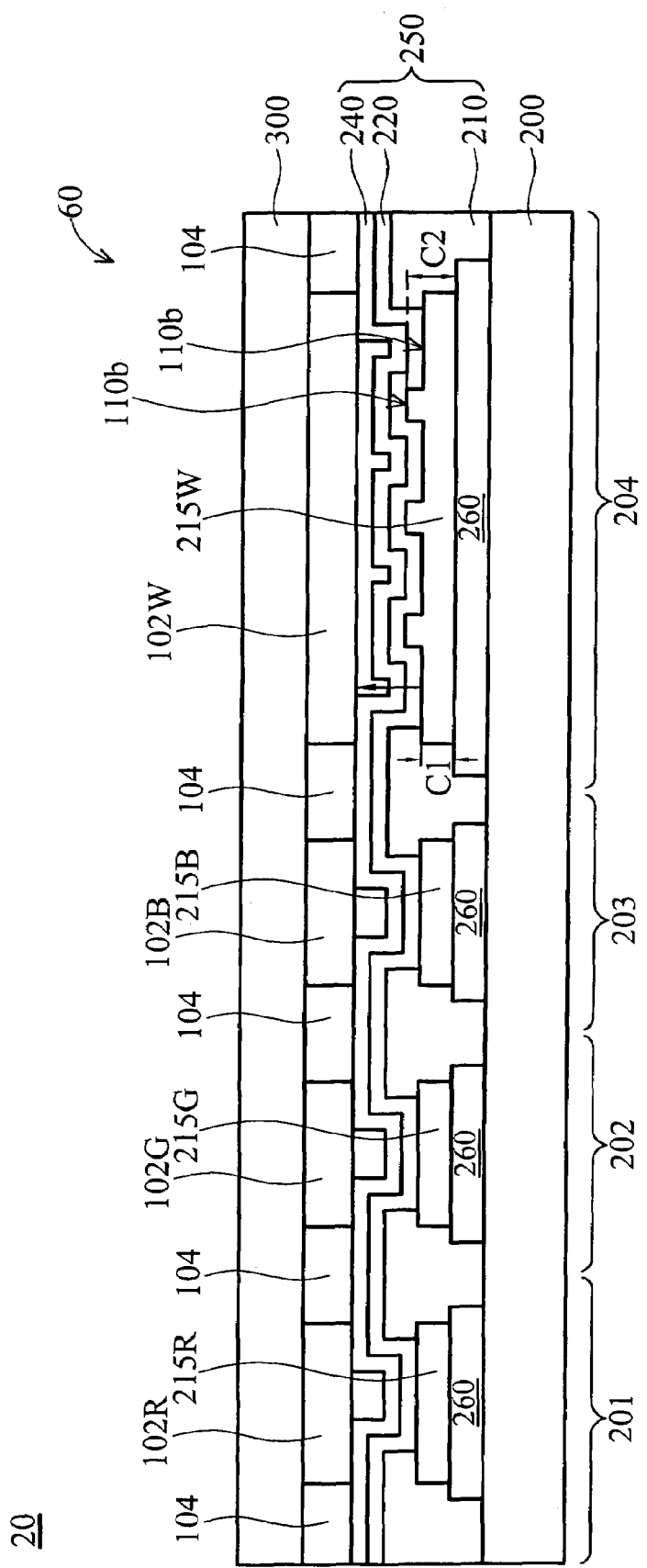
FIG. 2a shows a cross-sectional view of an embodiment of a top-emitting organic light-emitting device.

FIG. 2a shows a cross-sectional view of an embodiment of a top-emitting organic light-emitting device (OLED) 60. The OLED 60 comprises a pixel array substrate 200, a color filter substrate 300 and an organic electroluminescent multi-layer structure 250. In this embodiment, the pixel array substrate 200 and the color filter substrate 300 may comprise glass, quartz or other transparent material. The pixel array substrate 200 has a plurality of pixel areas and each pixel area may include a first sub-pixel area 204, a second sub-pixel area 201, a third sub-pixel area 202, a fourth sub-pixel area 203 and for displaying a white light, a red light, a green light, and a blue light, respectively. Moreover, one or multiple dielectric layers (not shown) may be formed on the pixel array substrate 200 to serve as a buffer layer, an interlayer dielectric (ILD) layer, inter-pixel dielectric layer, a planarization layer or a protective layer. The one or multiple dielectric layers may comprise silicon oxide and silicon nitride.

In a preferred embodiment, an inter-pixel dielectric layer 210 is disposed on the pixel array substrate 200 for isolating each bottom electrode which is disposed on the pixel array substrate 200 in subsequent processes. In addition, the color filter substrate 300 has a plurality of color units which include a red unit 102R, a green unit 102G, and a blue unit 102B corresponding to the second sub-pixel area 201, the third sub-pixel area 202 and the fourth sub-pixel area 203, respectively for producing a red light, a green light, and a blue light. The color filter substrate 300 also can comprise a transparent unit 102W corresponding to the first sub-pixel area 204 for producing a white light. Therefore, the second sub-pixel area 201, the third sub-pixel area 202 and the fourth sub-pixel area 203 define color saturation, and the first sub-pixel area 204 may generate a white light within the color saturation.

Figure 2B:
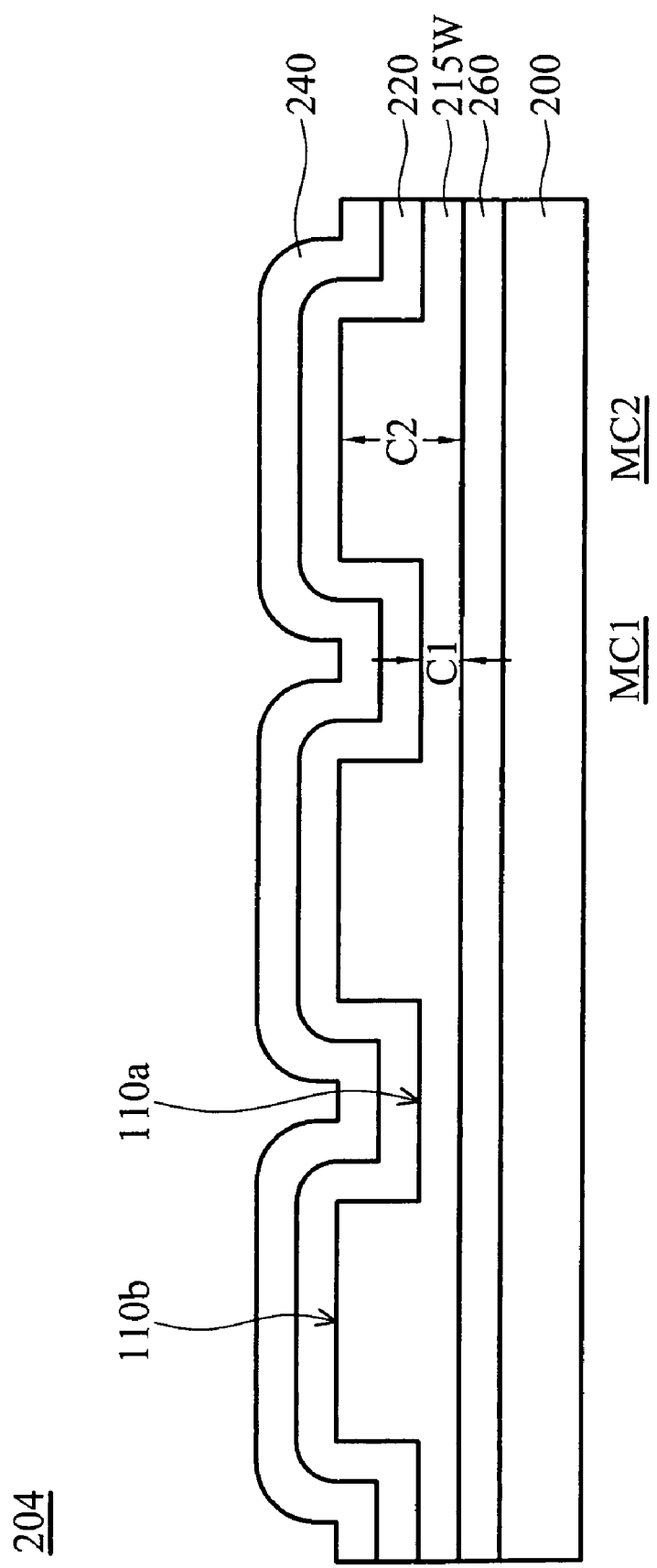
FIG. 2b shows a cross-sectional view of an embodiment of a bottom electrode having a thinner first portion and a thicker second portion.

The organic electroluminescent multi-layer structure 250 is formed on a pixel area 20 of the pixel array substrate 200. The organic electroluminescent multi-layer structure 250 includes a top electrode 240, a first bottom electrode 215W, a second bottom electrode 215R, a third bottom electrode 215G and a fourth bottom electrode 215B and the electrodes correspond to the first sub-pixel area 204, the second sub-pixel area 201, the third sub-pixel area 202 and the fourth sub-pixel area 203, respectively and an organic layer 220 which is disposed between the top electrode 240 and the bottom electrodes 215R, 215G, 215B and 215W. The top electrode 240, the bottom electrodes 215R, 215G, 215B and 215W may comprise a transparent conductive material, such as indium tin oxide (ITO), ZnO or the ZnO may be doped with other metals such as ZnO:Sn, ZnO:V, ZnO:Co, ZnO:Al, ZnO:Ga, ZnO:Ti or ZnO:In. The organic layer 220 is employed for light-emitting and typically comprises a stack of a hole injection layer (HIL), a hole transport layer (HTL), an emitting material layer (EML), an electron transport layer (ETL) and an electron injection layer (HIL). In order to simplify the diagram, only a single layer is depicted. In this device, a reflective layer 260 is formed under the bottom electrodes 215R, 215G, 215B and 215W for reflecting a light from the organic layer 220. In this embodiment, the thicknesses of the second bottom electrode 215R, the third bottom electrode 215G and the fourth bottom electrode 215B are the same. In another embodiment, the thicknesses of at least two of the second bottom electrode 215R, the third bottom electrode 215G or the fourth bottom electrode 215B are the same. Referring to FIG. 2b, an enlarged picture of the first sub-pixel area 204 of the FIG. 2a is illustrated. In this embodiment, the first bottom electrode 215W is a single layer including a thinner first portion C1 and a thicker second portion C2, wherein the thinner first portion C1 and the thicker second portion C2 are alternatively arranged. In addition, the thinner first portion C1 has a first upper surface 110a and the thicker second portion C2 has a second upper surface 110b, in which the first upper surface 110a is lower than the second upper surface 110b. It is noted that the first portion C1, the organic layer 220 and the top electrode 240 constitute a first micro-cavity portion MC1, the second portion C2, the organic layer 220 on the top of the second portion C2 and the top electrode 240 constitute a second micro-cavity portion MC2.

When the light emission of the organic layer 220 (as the arrow in FIG. 2a) passes through the organic layer 220 and the top electrode 240 from the first upper surface 110a and the organic layer 220 and the top electrode 240 from the second upper surface 110b, the first micro-cavity portion MC1 and the second micro-cavity portion MC2 can provide a wavelength shift of light in different directions due to the different optical lengths of the first micro-cavity portion MC1 and second micro-cavity portion MC2. For example, one of the first and second micro-cavity portions MC1 and MC2 leads the light wavelength shift toward the red-wavelength shift, and the other leads the light wavelength shift toward the blue-wavelength shift. Accordingly, the proportion of area of the thicker second portion C2 to the emission area of the first sub-pixel area 204 can be varied to mitigate micro-cavity effect from the organic layer 220, thereby balancing color shift in the first sub-pixel area 204 and at the same time increasing intensity of the white light. Then, the white light showing in the first sub-pixel area 204 may become close to a pure white position of color saturation. It should be noted that the proportion of area of the thicker second portion C2 to the emission area of the first sub-pixel area 204 is larger than at least 10%. Preferably, the proportion of area of the thicker second portion C2 to the emission area of the first sub-pixel area 204 can be between 40% and 60%.

Referring to FIG. 3a to FIG. 3d, enlarged diagrams of the forth pixel area 204 of FIG. 2a is illustrated in other embodiments. In these embodiments, the first bottom electrode 215W is a composite layer including a first transparent material layer M1 and a second transparent material layer M2 thereon. The first transparent material layer M1 may have a thickness the same as or different from the second transparent material layer M2. In one embodiment, the first and second transparent material layers M1 and M2 are formed by the same materials. However, in another embodiment, the transparent material layers M1 and M2 are respectively formed by different materials.

Figure 3A:
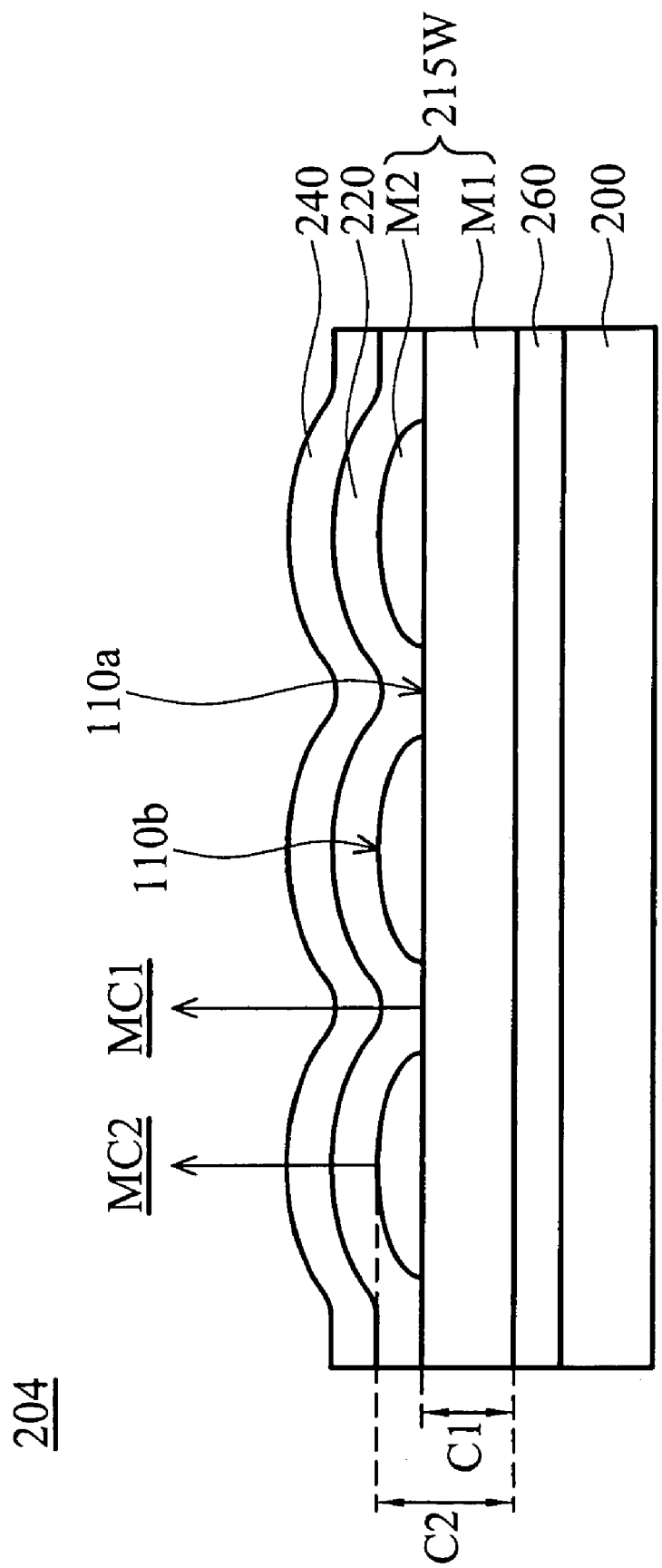

As shown in FIG. 3a, the difference between FIG. 3a and FIG. 2b is that the first bottom electrode 215W is formed by the first transparent material layer M1 with a uniform thickness and the second transparent material layer M2 of a plurality of hemispherical structures which are isolated by a predetermined interval for forming the thinner first portion C1 and the thicker second portion C2.

Figure 3B:
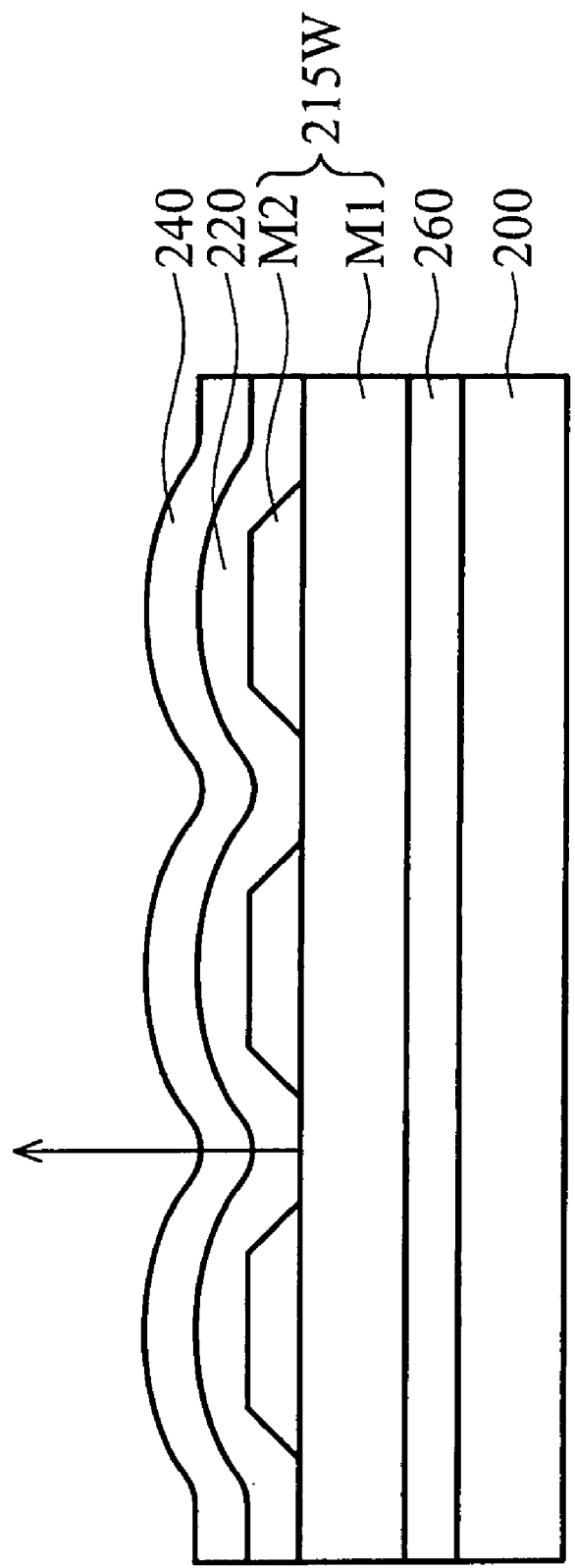

Alternatively, other geometric figures can also be used to form the second transparent material layer M2 such as square, ladder-shaped or other suitable geometric figures. As shown in FIG. 3b, in another embodiment, the second transparent material layer M2 of a plurality of isolated ladder-shaped structures is used instead of the second transparent material layer M2 of the hemispherical structures of FIG. 3a.

Figure 3C:
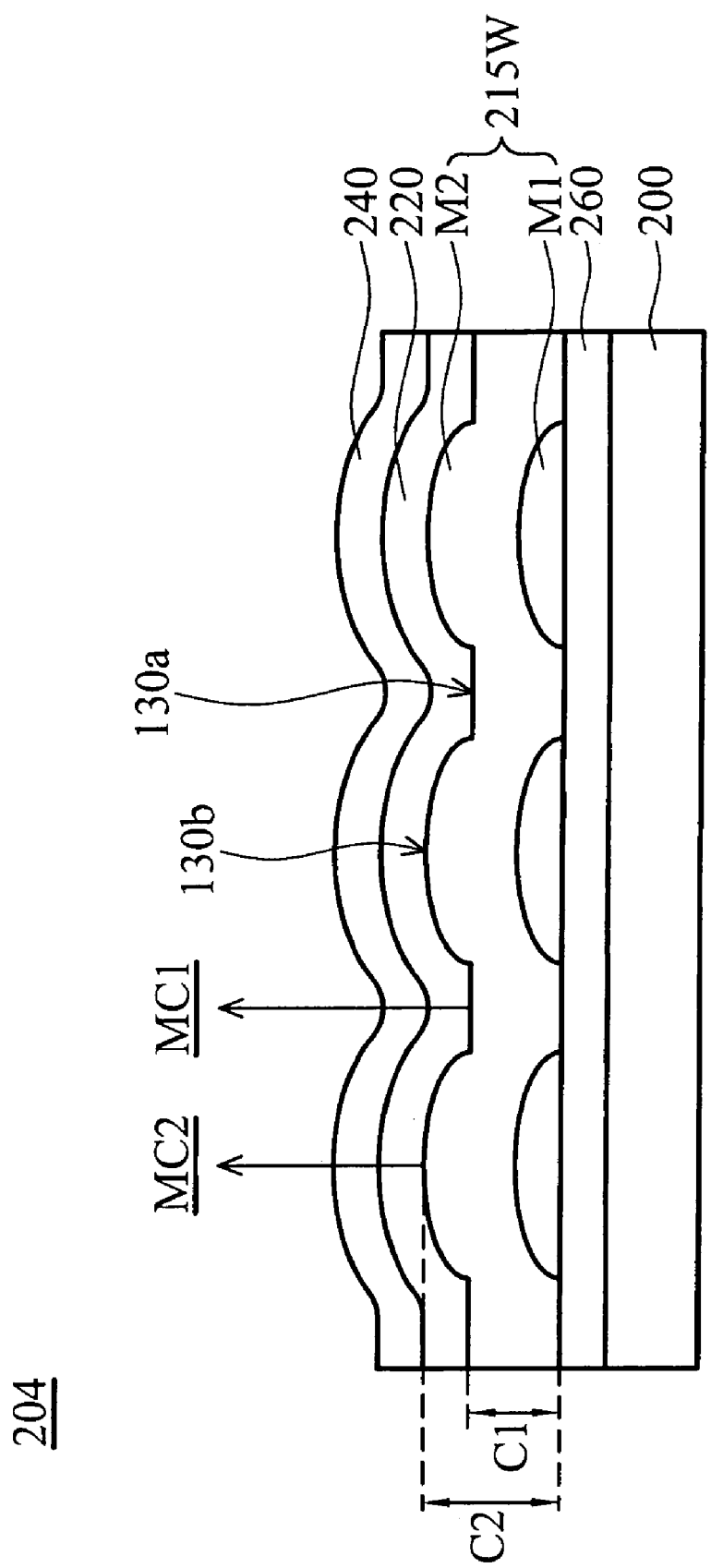

Referring to FIG. 3c, the differences between FIG. 3a and FIG. 3c are that the first bottom electrode 215W includes the first transparent material layer M1 of a plurality of hemispherical structures which are isolated by a predetermined interval and the second transparent material layer M2 covers comfortably on the first transparent material layer M1 and a portion of the pixel array substrate 200 in order to form the thinner first portion C1 and the thicker second portion C2.

Figure 3D:
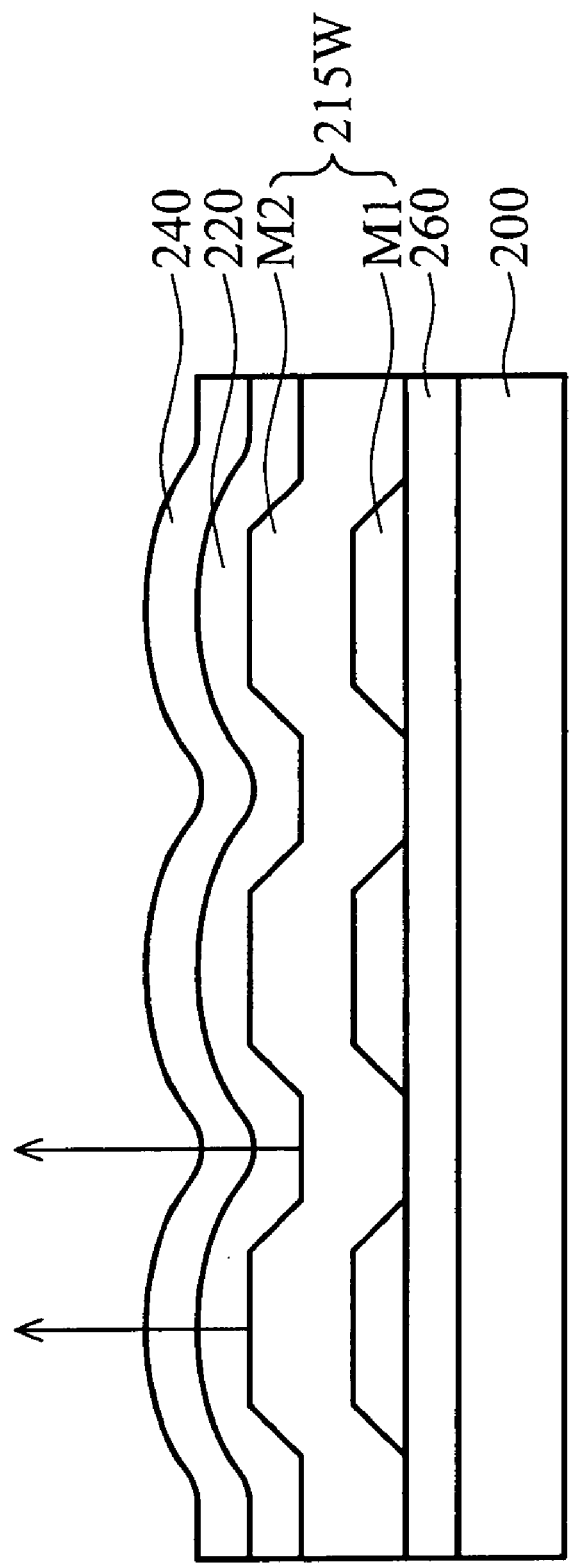

Similarly, the first transparent material layer M1 and the second transparent material layer M2 can also use other geometric figures such as square, ladder-shaped or other suitable geometric figures. As shown in FIG. 3d, in another embodiment, the first transparent material layer M1 and the second transparent material layer M2 of a plurality of isolated ladder-shaped are used instead of the first transparent material layer M1 and the second transparent material layer M2 of hemispherical structures of FIG. 3c, respectively.

Figure 4:
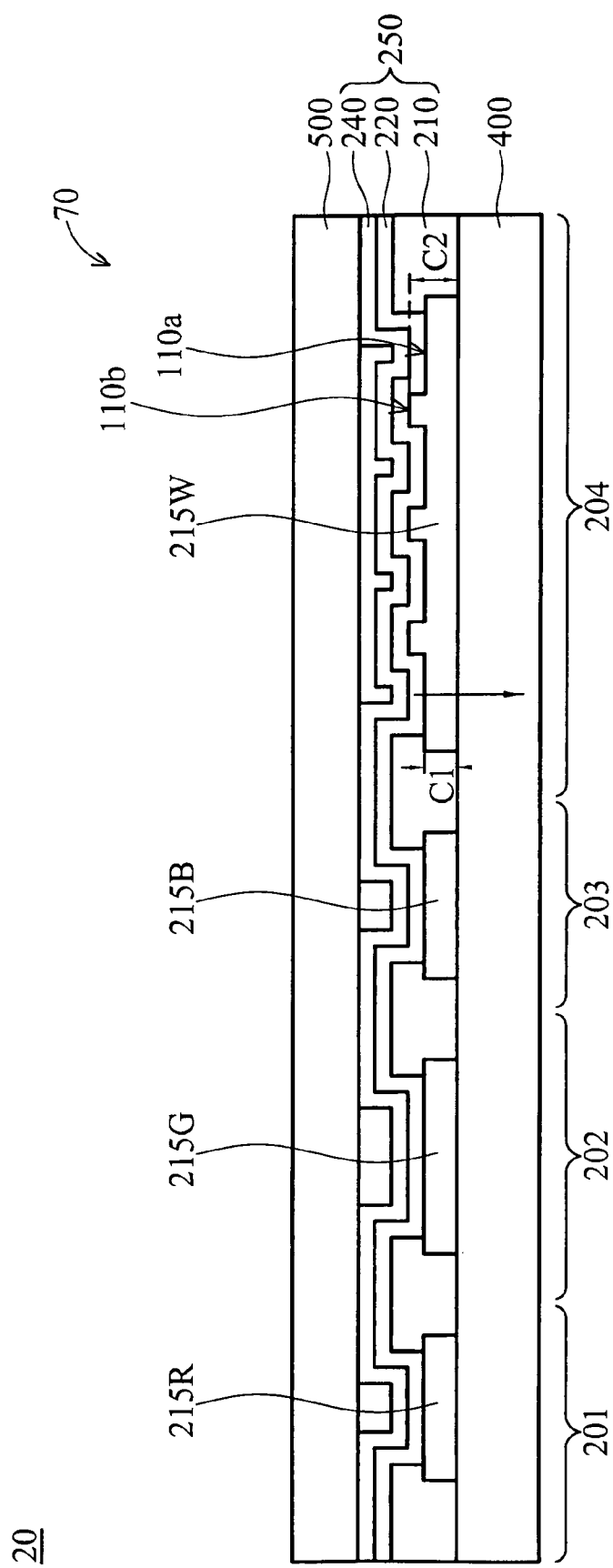
FIG. 4 is a cross-sectional view of a preferred embodiment of a top-emitting organic light-emitting device.

FIG. 4 shows a cross section of an embodiment of a bottom-emitting organic light-emitting device 70. The differences between FIG. 4 and FIG. 2a are, in this embodiment, an opaque material as the top electrode 240 is used for reflecting emission light from organic layer 220. Therefore, it is not necessary to form an additional reflective layer under the bottom electrodes 215R, 215G, 215B and 215W. Moreover, in this embodiment, the bottom-emitting organic light-emitting device 70 includes an array substrate 400 with a color filter on array (COA) and an upper substrate 500 such as a glass substrate. It is noted that since the array substrate 400 has a color filter on array (not shown), the organic layer 220 of the second, third and fourth bottom electrodes 215R, 215G and 215B can emit, respectively a red, green, and blue light.

Similarly, the first bottom electrode 215W can be a single layer or a composite layer. Moreover, if the first bottom electrode 215W is a single layer, the first bottom electrode 215W can include a thinner portion C1 and a thicker portion C2. If the first bottom electrode 215W is a composite layer comprising the first and second transparent material layers, the first and second transparent material layers can be made a geometric figure or a combination which is the same as the embodiments of FIG. 3a to FIG. 3d.

Figure 5:
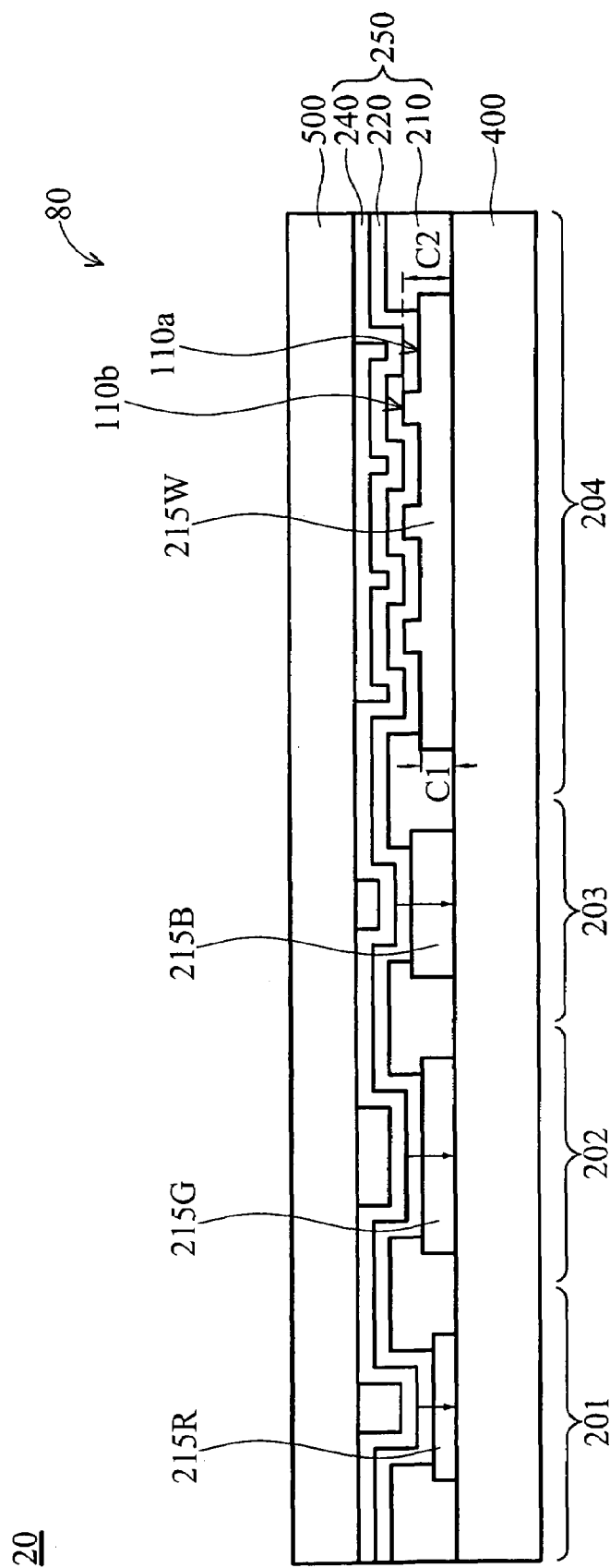
FIG. 5 is a cross-sectional view of an embodiment of a top-emitting organic light-emitting device.

FIG. 5 shows a cross section of another embodiment of a bottom-emitting organic light-emitting device 80. The difference between FIG. 5 and FIG. 4 is that the thicknesses of the second bottom electrode 215R, the third bottom electrode 215G and the fourth bottom electrode 215B are different.

Because of the different thicknesses of the second, third and fourth bottom electrodes 215R, 215G and 215B, the bottom electrodes can provide different directions of wavelength shift of light when the light emission (as the arrow indicates in FIG. 3) passes through them. Thus, the color saturation, which is defined by the sub-pixel areas, can be adjusted.

Figure 6:
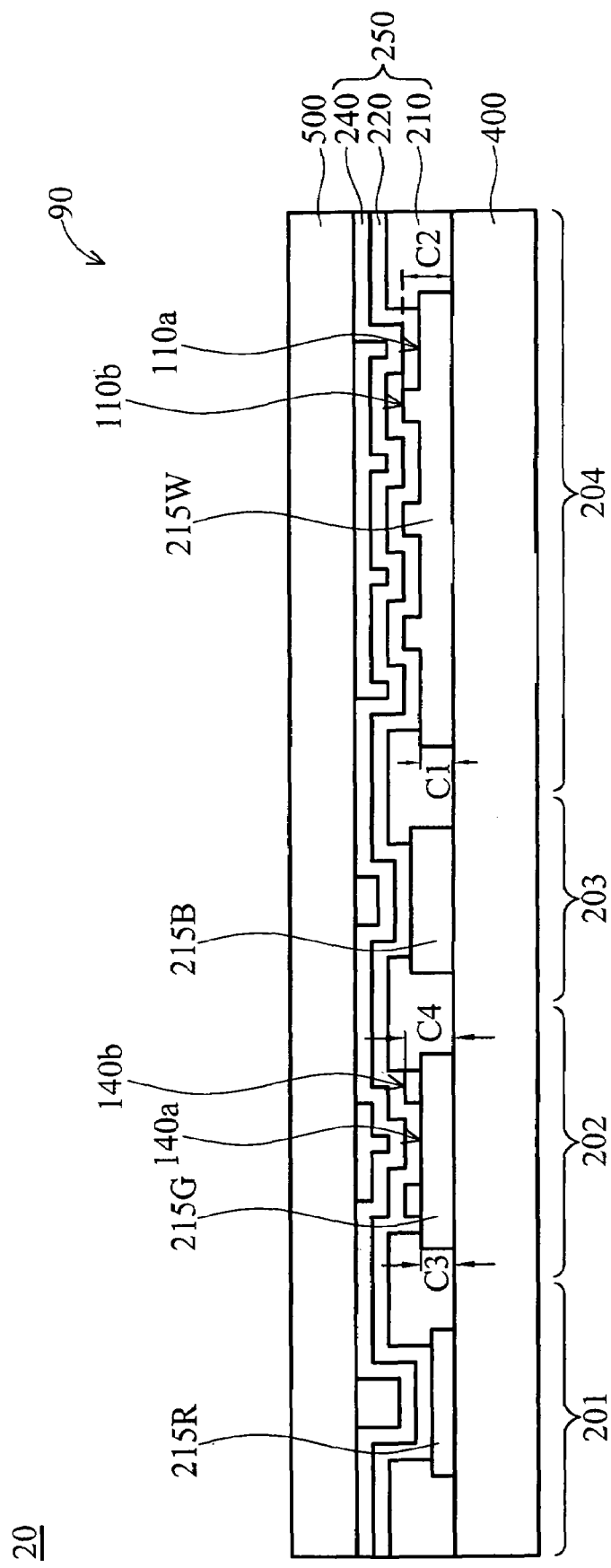
FIG. 6 is a cross-sectional view of a preferred embodiment of a top-emitting organic light-emitting device.

FIG. 6 shows a cross section of an embodiment of a bottom-emitting organic light-emitting device 90. The difference between FIG. 6 and FIG. 4 is that the third bottom electrode 215G includes a thinner first portion C3 and a plurality of thicker second portions C4, wherein the thinner first portion C3 and the thicker second portions C4 are alternatively arranged.

In this embodiment, the thinner first portion C1 of the first bottom electrode 215W has a first upper surface 110a and the thicker second portion C2 has a second upper surface 110b. Moreover, the thinner first portion C3 of the third bottom electrode 215G has a third upper surface 140a and the thicker second portion C4 has a fourth upper surface 140b, wherein the first upper surface 110a is lower than the second upper surface 110ba and the third upper surface 140a is lower than the fourth upper surface 140b. It is noted that, in the first sub-pixel area 204, the first micro-cavity portion MC1 comprises a stack of the thinner first portion C1, the organic layer 220 and the top electrode 240. A second micro-cavity portion MC2 comprises a stack of the thicker second portion C2, the organic layer 220 and the top electrode 240. Moreover, in the third sub-pixel area 202, a third micro-cavity portion MC3 comprises a stack of the thinner first portion C3, the organic layer 220 and the top electrode 240. A fourth micro-cavity portion MC4 comprises a stack of the thicker second portion C4, the organic layer 220 and the top electrode 240.

In another embodiment, the thinner first portion C3 and the thicker second portion C4 are formed on at least one of the second bottom electrode 215R, the third bottom electrode 215G and the fourth bottom electrode 215B. For example, the thinner first portion C3 and the thicker second portion C4 are formed on the third bottom electrode 215G for improving light intensity. In addition, a thinner first portion C1 and a thicker second portion C2 (not shown) can be disposed on the first bottom electrode 215W to mitigate micro-cavity effect from the organic layer 220, thereby balancing color shift in the first sub-pixel area 204.

FIG. 7 schematically shows an embodiment of a system for displaying images which, in this case, is implemented as an OLED display panel 700 or an electronic device 800. Generally, the electronic device 800 can comprise an input unit 600 and the OLED display panel 700. Further, the input unit 600 is operatively coupled to the OLED display panel 700 and provides input signals (e.g., an image signal) to the OLED display panel 700 to generate images. The electronic device 800 can be a mobile phone, digital camera, PDA (personal data assistant), notebook computer, desktop computer, television, GPS (Global Positioning System), car display, aviation display, digital photo frame or portable DVD player, for example.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An organic light-emitting device, comprising:
an array substrate having a white sub-pixel region; and
an organic electro-luminescent multi-layer structure disposed on the white sub-pixel region of the array substrate comprising a top electrode, a first bottom electrode and an emission layer therebetween, wherein the first bottom electrode has a thinner first portion and a thicker second portion for providing a wavelength shift of light in different directions, and wherein the thinner first portion and the thicker second portions are alternatively arranged.

2. The organic light-emitting device as claimed in claim 1, further comprising red, blue and green sub-pixel areas disposed on the array substrate, wherein the red, blue and green sub-pixel areas comprise a second, a third and a fourth bottom electrode, respectively.

3. The organic light-emitting device as claimed in claim 2, wherein at least two of the second, third and fourth bottom electrodes have the same thickness.

4. The organic light-emitting device as claimed in claim 3, wherein the first, second, third and fourth bottom electrodes are a single layer.

5. The organic light-emitting device as claimed in claim 3, wherein the first, second, third and fourth bottom electrodes comprise ITO, IZO, ZnO:Sn, ZnO:V, ZnO:Co, ZnO:Al, ZnO:Ga, ZnO:Ti, or ZnO:In.

6. The organic light-emitting device as claimed in claim 2, wherein the second, third and fourth bottom electrodes have the same thickness.

7. The organic light-emitting device as claimed in claim 2, wherein the second, third and fourth bottom electrodes have different thicknesses.

8. The organic light-emitting device as claimed in claim 1, wherein the thinner first portion is circular or square.

9. The organic light-emitting device as claimed in claim 1, wherein the thicker second portion is circular or square.

10. The organic light-emitting device as claimed in claim 1, wherein a proportion of area of the thicker second portion to the emission area of the white sub-pixel area is not less than 10%.

11. The organic light-emitting device as claimed in claim 1, wherein a proportion of area of the thicker second portion to the emission area of the white sub-pixel area is between 40% and 60%.

12. The organic light-emitting device as claimed in claim 1, wherein the organic light-emitting device is a top-emitting organic light-emitting device, and the top electrode comprises a transparent conductive material.

13. An electronic device, comprising:
the organic light-emitting device as claimed in claim 1; and
an input unit coupled to the organic light-emitting device and operative to provide input signals to the organic light-emitting device to generate images.

14. The electronic device as claimed in claim 13, wherein the electronic device is a mobile phone, digital camera, PDA (personal digital assistant), notebook computer, desktop computer, television, GPS, car display, aviation display, digital photo frame or portable DVD player.

15. An organic light-emitting device, comprising:
an array substrate having a white sub-pixel region;
an organic electro-luminescent multi-layer structure disposed on the white sub-pixel region of the array substrate comprising a top electrode, a first bottom electrode and an emission layer therebetween, wherein the first bottom electrode has a thinner first portion and a thicker second portion for providing a wavelength shift of light in different directions; and
red, blue and green sub-pixel areas disposed on the array substrate, wherein the red, blue and green sub-pixel areas comprise a second, a third and a fourth bottom electrode, respectively,
wherein at least one of the second, third and fourth bottom electrodes has a thinner first portion and a thicker second portion.

16. An organic light-emitting device, comprising:
an array substrate having a white sub-pixel region; and
an organic electro-luminescent multi-layer structure disposed on the white sub-pixel region of the array substrate comprising a top electrode, a first bottom electrode and an emission layer therebetween, wherein the first bottom electrode has a thinner first portion and a thicker second portion for providing a wavelength shift of light in different directions,
wherein the first bottom electrode is a composite layer including a first transparent material layer and a second transparent material layer thereon.

17. The organic light-emitting device as claimed in claim 16, wherein the thinner first portion comprises the first transparent material layer and the thicker second portion comprises the first and second transparent material layers.

18. The organic light-emitting device as claimed in claim 16, wherein the first transparent material layer and the second transparent material layer have the same thickness and comprise different conductive materials.

19. The organic light-emitting device as claimed in claim 16, wherein the first transparent material layer and the second transparent material layer comprise the same conductive material, and have different thicknesses.

20. The organic light-emitting device as claimed in claim 16, wherein the thinner first portion and the thicker second portions are alternatively arranged.

* * * * *